(12) United States Patent
Basol

(10) Patent No.: US 7,829,785 B2
(45) Date of Patent: Nov. 9, 2010

(54) THIN FILM SOLAR CELL WITH FINGER PATTERN

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 412 days.

(21) Appl. No.: 11/834,593

(22) Filed: Aug. 6, 2007

(65) Prior Publication Data

US 2008/0053522 A1 Mar. 6, 2008

Related U.S. Application Data

(60) Provisional application No. 60/821,559, filed on Aug. 4, 2006.

(51) Int. Cl.
*H01L 31/0224* (2006.01)

(52) U.S. Cl. .................................... 136/256

(58) Field of Classification Search .......... 136/243–265
See application file for complete search history.

(56) References Cited

U.S. PATENT DOCUMENTS

| | | | |
|---|---|---|---|
| 3,493,822 A | * | 2/1970 | Iles ............................ 136/256 |
| 4,590,327 A | | 5/1986 | Nath et al. |
| 4,633,033 A | | 12/1986 | Nath et al. |
| 5,021,099 A | | 6/1991 | Kim et al. |
| 5,476,553 A | | 12/1995 | Hanoka et al. |
| 5,800,631 A | | 9/1998 | Yamada et al. |
| 6,566,162 B2 | | 5/2003 | Yamada et al. |
| 2006/0160261 A1 | | 7/2006 | Sheats et al. |

OTHER PUBLICATIONS

International Search Report issued Aug. 5, 2008 in PCT/US2007/75295.

* cited by examiner

*Primary Examiner*—Jessica L Ward
*Assistant Examiner*—Kevin E Yoon
(74) *Attorney, Agent, or Firm*—Pillsbury Winthrop Shaw Pittman, LLP

(57) ABSTRACT

The present invention relates to thin film solar cell structures and methods of manufacturing them. In particular and in one aspect the present invention is related to apparatus and methods for forming a solar cell structure in which an insulator film is disposed over a region of a conductive contact layer, which is either adjacent or below the absorber layer.

9 Claims, 4 Drawing Sheets

THIN FILM SOLAR CELL WITH FINGER PATTERN

CROSS-REFERENCE TO RELATED APPLICATIONS

This application claims priority to U.S. Provisional Application No. 60/821,559 filed Aug. 4, 2006 entitled "Thin Film Solar Cell With Finger Pattern," which is incorporated herein in its entirety.

FIELD OF THE INVENTION

The present invention relates to thin film solar cell structures and methods of manufacturing them.

BACKGROUND OF THE INVENTION

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods. Group IIB-VIA compounds such as CdTe, Group IBIIIAVIA compounds and amorphous Group IVA materials such as amorphous Si and amorphous Si alloys are important thin film materials that are being developed.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Among the family of compounds, best efficiencies have been obtained for those containing both Ga and In, with a Ga amount in the 15-25%. Recently absorbers comprising Al have also been developed and high efficiency solar cells have been demonstrated using such absorbers.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13 or a contact layer, which is previously deposited on the substrate 11 and which acts as the electrical ohmic contact to the device. The most commonly used contact layer or conductive layer in the solar cell structure of FIG. 1 is Molybdenum (Mo). If the substrate itself is a properly selected conductive material such as a Mo foil, it is possible not to use a conductive layer 13, since the substrate 11 may then be used as the ohmic contact to the device. The conductive layer 13 may also act as a diffusion barrier in case the metallic foil is reactive. For example, foils comprising materials such as Al, Ni, Cu may be used as substrates provided a barrier such as a Mo layer is deposited on them protecting them from Se or S vapors. The barrier is often deposited on both sides of the foil to protect it well. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

CdTe solar cell structure is typically a superstrate structure that is obtained by first depositing a transparent conductive layer (TCO) on a transparent substrate such as glass, and then depositing layers of CdS, CdTe and an ohmic contact. The ohmic contact is traditionally a metallic contact such as Ni or an ink deposited material comprising graphite. A small amount of Cu is also traditionally added to the ohmic contact composition to improve its performance. CdTe solar cells with above 16% conversion efficiency have been demonstrated with such structures.

Thin film photovoltaic devices may be manufactured in the form of monolithically integrated modules where electrical interconnection of individual solar cells in a series is achieved on a single substrate, such as a glass sheet, during the film deposition steps and a module with high voltage is obtained. Alternatively thin film solar cells may be manufactured individually and then connected in series, through use of soldering or conductive epoxies just like Si solar cells to obtain high voltage modules. In this case, solar cells often need to be large area, one dimension being more than 1", typically more than 3". Such large area requires deposition of finger patterns over the top conducting layer of the solar cell, such as the transparent layer 14 in FIG. 1.

FIGS. 2a and 2b show a top view and a cross-sectional view (taken at location A-A'), respectively, of an exemplary prior art $Cu(In,Ga)(Se,S)_2$ solar cell 20 fabricated on a conductive foil substrate 25 such as a stainless steel foil or an aluminum-based foil. The solar cell 20 has an optional back contact layer 26, an active layer 27, a transparent conductive layer 28, and a finger pattern comprising fingers 21 and a busbar 22. If the conductive foil substrate 25 itself is a good ohmic contact material (such as Mo) there may not be a need for a back contact layer 26. Otherwise a material such as Mo may be used to form a back contact layer 26. As an example, the thicknesses of the transparent conductive layer 28 and the active layer 27 are 500-1000 nm and 1000-2000 nm, respectively. The active layer 27 may comprise an absorber layer such as a $Cu(In,Ga)(Se,S)_2$ and a junction partner such as a CdS buffer layer which lies between the absorber layer and the transparent conductive layer 28. The thickness of the busbar 22 and the fingers 21 may be in the range of 12000-120000 nm, busbar 22 being thicker than the fingers 21. When solar cells with the structure shown in FIGS. 2a and 2b are interconnected, the bottom electrode, or the conductive foil substrate, of one cell is electrically connected to the busbar of the next cell. During this interconnection process ribbons may be soldered onto the busbars and bottom electrodes of the cells or the cells may be laid on each other in a shingled manner so that the bottom electrode of one cell touches the busbar of the next cell. After positioning this way, cells may be pressed together and heat may be applied to assure good contact. It should be appreciated that the thin film structure of FIGS. 2a and 2b is rather fragile because the active layer thickness is only 1000-2000 nm. Physical stress during shingle interconnection or thermal stress generated by heating or soldering processes cause damage to the active layer 27, especially right under the busbar 22, and result in electrical shorts between the busbar 22 and the conductive foil substrate 25 through the damaged active layer. Another shorting path is the exposed edge wall 25a of the conductive foil substrate 25 at the edge region 29. Interconnect soldering materials, conductive epoxies, conductive inks etc. may flow along this exposed edge wall 25a and create an electrical short between the transparent conductive layer 28 and the conductive foil substrate 25. Such shorts reduce yield and deteriorate efficiency of the modules manufactured using thin film solar cells.

In prior work, approaches have been developed to reduce or eliminate shunting effects in thin film structures. U.S. Pat. Nos. 4,590,327 and 4,633,033 discuss some of these approaches, which address possible shunting effects between a busbar of a finger pattern and the underlying active layer comprising an absorber layer. Accordingly, referring to FIG. 2B, these approaches introduce a high resistance layer at the interface 28a between the busbar 22 and the transparent conductive layer 28. Such approaches have certain shortcomings. One problem is the fact that since the high resistance layer is deposited over the transparent conductive layer, its adhesion is controlled by the adhesion of the transparent conductive layer to the active layer as well as the adhesion of the active layer to the back contact layer. When the busbar is formed over the high resistance layer, therefore, its mechanical and electrical stability is a strong function of the mechanical stability of the underlying active layer, which, in thin film structures sometimes cannot support the stress introduced by the thick busbar and annealing and lamination processes. If busbars detach from the substrate due to poor adhesion of the active layer to the back contact, solar cell efficiency suffers.

As the brief review above suggests there is a need to develop device structures and manufacturing approaches to reduce shunting effects in thin film solar cells.

SUMMARY OF THE INVENTION

The present invention relates to thin film solar cell structures and methods of manufacturing them.

In one aspect the present invention is a solar cell structure that comprises a substrate with a top surface, an edge, a sidewall and a bottom surface; a conductive contact layer disposed over the top surface of the substrate, an insulator film disposed over a region of the conductive contact layer; an absorber layer disposed over at least another region of the conductive contact layer that is different from the region of the conductive contact layer; a transparent conductive layer disposed over at least the absorber layer; and a finger pattern including a set of fingers and a busbar, the finger pattern disposed over the transparent conductive layer, wherein the busbar is aligned substantially over the insulator film.

In another aspect, the present invention includes a method of forming a solar cell structure, which can preferably include providing a substrate; depositing a conductive contact layer over the substrate; depositing an insulator film over a region of the conductive contact layer; forming an absorber layer over at least another region of the conductive contact layer that is different from the region of the conductive contact layer; depositing a transparent conductive layer over at least the absorber layer; and forming a finger pattern including a set of fingers and a busbar over the transparent conductive layer, wherein the busbar is aligned substantially over the insulator film.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION

Figure 1:
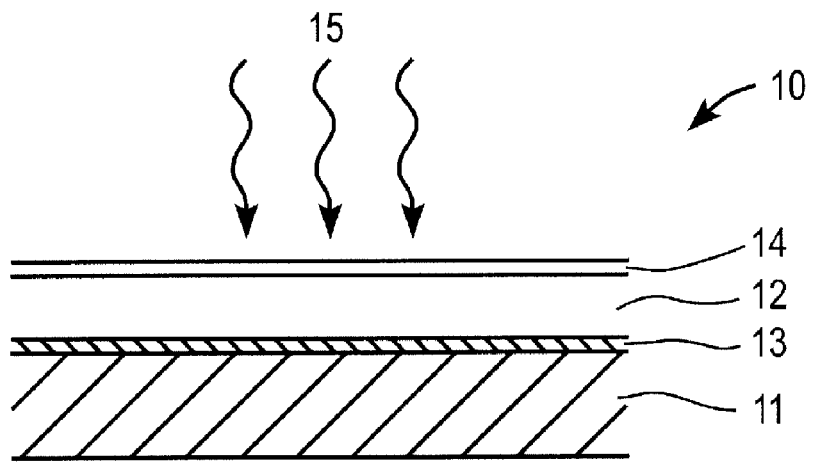
FIG. 1 is a cross-sectional view of a solar cell employing a Group IBIIIAVIA absorber layer.
Figure 2A:
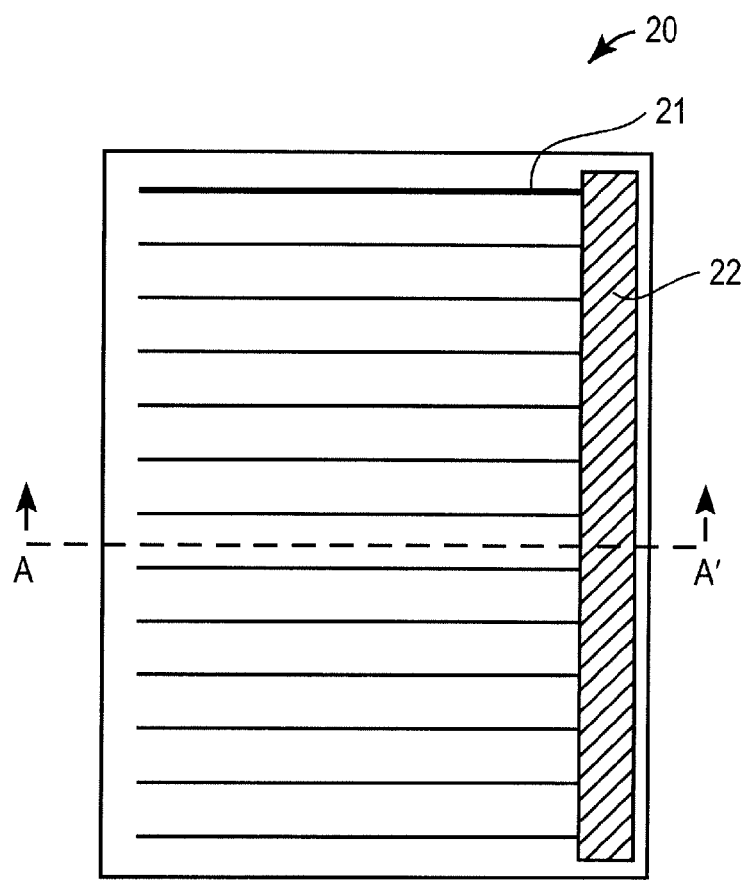
FIG. 2a is a top view of a prior-art thin film solar cell.
Figure 2B:
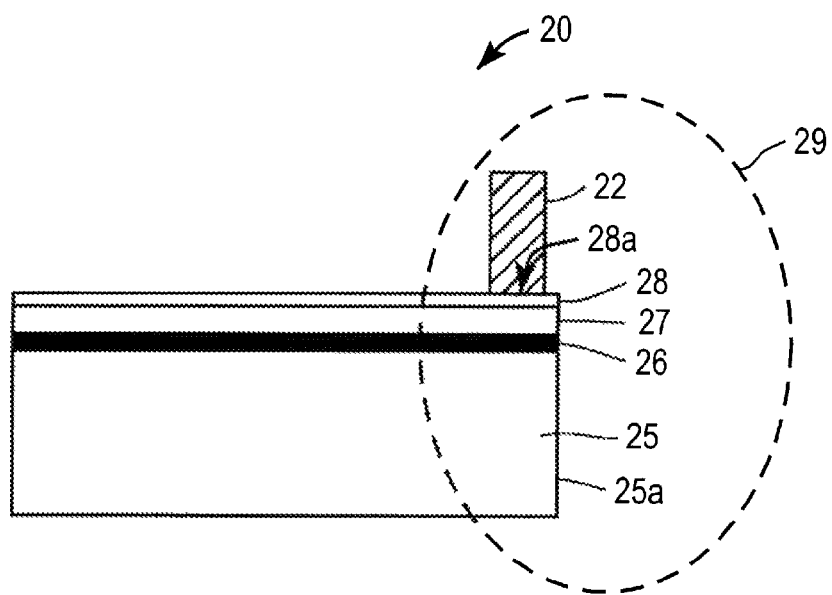
FIG. 2b is a cross-sectional view of a prior-art thin film solar cell.
Figure 3:
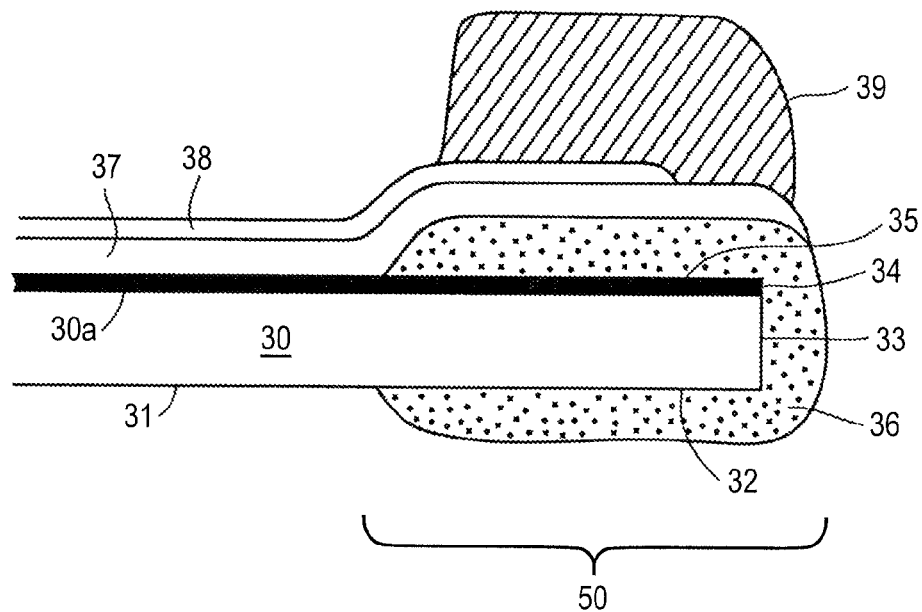
FIG. 3 is a cross-sectional view of an edge region of a solar cell fabricated in accordance with an embodiment of the present invention.

FIG. 3 shows a cross-sectional view of the edge region of an exemplary $Cu(In,Ga)(Se,S)_2$ solar cell structure fabricated in accordance with an embodiment of the present invention. The solar cell comprises a conductive substrate 30 with a top surface 30a, a bottom surface 31 and an edge side wall 33. Portion of the bottom surface 31 close to the edge side wall 33 is an edge bottom surface 32. A conductive layer 34, such as a Mo layer, is deposited on the top surface 30a. The conductive layer 34 acts as the ohmic contact to the device and may wrap around and also deposit on the edge side wall 33 (not shown). After depositing the conductive layer 34 an insulating layer 36 is deposited at the edge region where a busbar 39 will later be formed. The insulating layer 36 is formed on the edge top surface 35 of the conductive layer 34. It preferably also covers the edge side wall 33 of the conductive substrate 30. Optionally it may wrap around and extend onto the edge bottom surface 32 of the conductive substrate 30 as shown in FIG. 3. The insulating layer 36 may be a high temperature material deposited by various techniques such as physical vapor deposition (PVD), ink writing, sol-gel, dipping etc. Dipping the edge of the conductive substrate into an ink or sol-gel solution is especially suited to obtain the wrap-around structure shown in the figure. The insulating material may be an oxide such as silicon oxide, aluminum oxide etc., a polymeric material such as polyimide, or any other suitable material that is stable at temperatures used for processing of the solar cell. Next step in the process is the growth of an active layer 37 over the conductive layer 34. It should be noted that the active layer 37 includes an absorber layer, in this example a layer of $Cu(In,Ga)(Se,S)_2$, and it may optionally also include a buffer layer such as a CdS layer, an In—O—S layer, a ZnSe layer etc., on top of the absorber layer. A transparent conductive layer 38, such as a transparent conductive oxide (TCO) is deposited on the active layer 37. A finger pattern including fingers (not shown) and a busbar 39 is then formed over the transparent conductive layer 38 by aligning the busbar 39 with the insulating layer 36 so that the busbar 39 is formed over the insulating layer 36.

The structure in FIG. 3 is robust. The edge region of the cell is protected by the insulating layer 36. Electrical connection to the busbar 39 may be made by various means including soldering without fear of shorting because even if the active layer 37 is damaged during soldering at the edge region, the insulating layer 36 protects the top edge surface 35 of the conductive layer 34. Since conductivity in the plain of the active layer 37 is rather low, shunting through lateral conduction through the active layer is negligible.

It should be noted that although the conductive layer 34 extends all the way to the edge in FIG. 3, this is not necessary. The conductive layer 34 may not extend to underneath of the insulating layer 36. Similarly, the active layer 37 may not extend to over the insulating layer 36. It should be noted that if a technique such as a PVD method, electroless deposition approach or ink deposition technique, etc., is used the active layer 37 may deposit over the insulating layer 36 (unless masked) at the edge region (as shown in the figure) since these techniques can deposit films on insulators. One preferred method of this invention is using electrodeposition for the formation of at least part of the active layer 37. Such electrodeposition methods are reviewed and disclosed in applicant's co-pending U.S. patent application Ser. No. 11/081, 308 filed Mar. 15, 2005 entitled Technique and Apparatus For Depositing Thin Layers of Semiconductors For Solar Cell Fabrication, now issued as U.S. Pat. No. 7,374,963; U.S. patent application Ser. No. 11/266,013 filed Nov. 2, 2005 entitled Technique and Apparatus For Depositing Layers of Semiconductors For Solar Cell And Modular Fabrication, now issued as U.S. Pat. No. 7,736,940; and U.S. patent application Ser. No. 11/462,685 filed Aug. 4, 2006 entitled Technique For Preparing Precursor Films And Compound Layers For Thin Film Solar Cell Fabrication And Apparatus Corresponding Thereto, which applications are expressly incorporated by reference herein.

Figure 4:
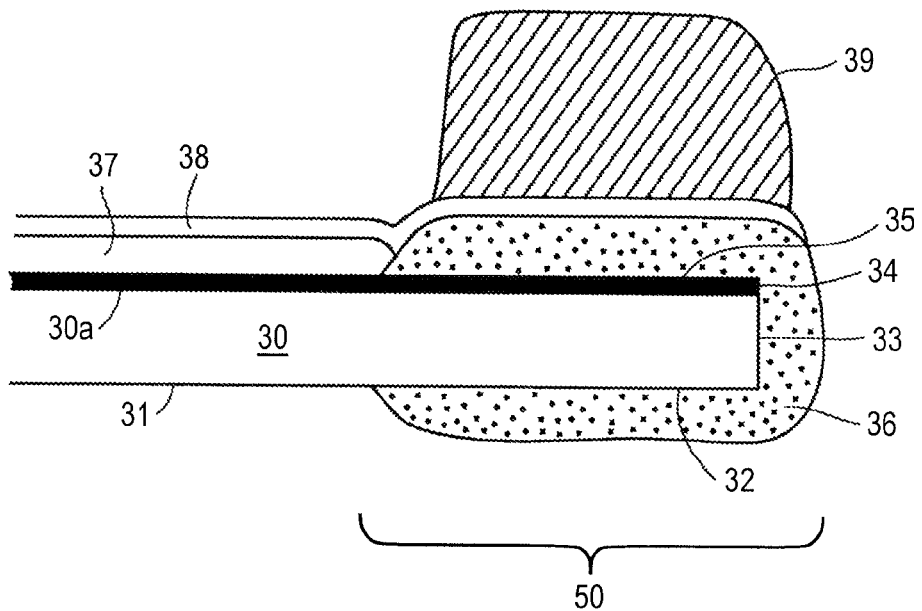
FIG. 4 shows the solar cell structure of another embodiment.

Electrodeposition forms layers only in areas that are not masked by an insulator. Therefore, by using electrodeposition for the formation of an active layer, a device structure such as the one shown in FIG. 4 may be obtained. The insulating layer, instead of being deposited, may be formed from the conductive layer 34 and/or the conductive substrate 30. For example, if the conductive substrate 30 is an aluminum-based material such as aluminum or an aluminum alloy, the edge region 50 may be anodized in an electrolyte. Anodization may dissolve the portion of the conductive layer 34 within the edge region and then form an insulating oxide layer on the anodized surface of the conductive substrate 30. If the conductive layer 34 is an anodizable material such as Ta, then the surface or substantially all the conductive layer 34 within the edge region 50 may get oxidized forming an insulating layer 36. In FIGS. 3 and 4, the finger pattern including the busbar 39 is deposited after the deposition of the transparent conductive layer 38. Alternatively, the transparent conductive layer 38 may be deposited after the deposition of the finger pattern.

Figure 5:
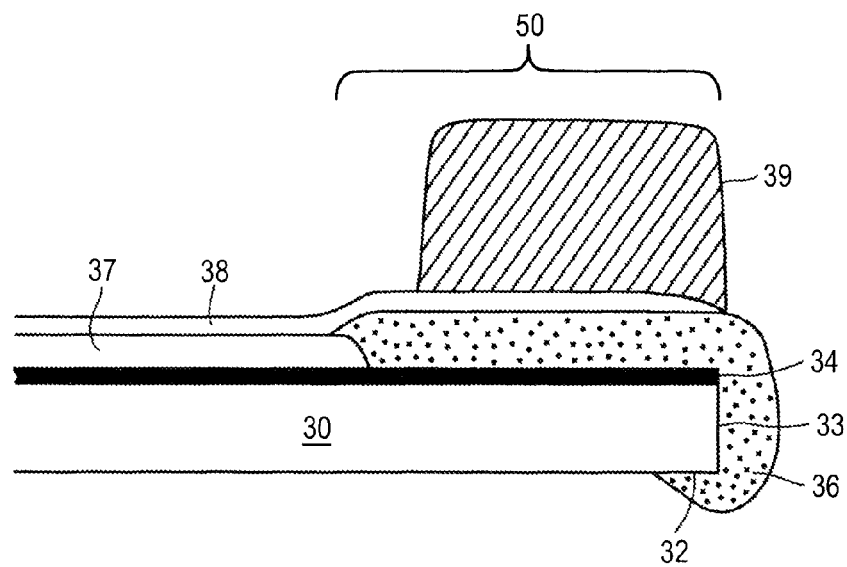
FIG. 5 shows the solar cell structure with selectively deposited active layer.

FIG. 5 demonstrates yet another embodiment of this invention. In this embodiment, the active layer 37 is deposited over the conductive layer 34 substantially everywhere over the conductive substrate 30 except at the edge region 50 where the busbar 39 would be formed. Such selective deposition of the active layer 37 may be achieved by masking the surface of the conductive layer 34 at the edge region 50 during growth of the active layer 37. In case electrodeposition is utilized for the formation of the active layer 37, the top surface of the conductive layer 34 or the top surface of the conductive substrate 30 at the edge region 50 may be rendered insulating or a material may be deposited on these surfaces on which electrodeposition cannot initiate. For example, if the conductive substrate 30 is an aluminum-based material such as aluminum or an aluminum alloy, the edge region 50 may be anodized in an electrolyte. Anodization may dissolve the portion of the conductive layer 34 within the edge region and then form an insulating oxide layer on the anodized surface of the conductive substrate 30. If the conductive layer 34 is an anodizable material such as Ta, then the surface or substantially all the conductive layer 34 within the edge region 50 may get oxidized forming insulating species. An alternative way of obtaining the structure shown in FIG. 5 comprises deposition of the active layer 37 over the whole surface of the conductive layer 34 including the edge region 50, and then removing the active layer portion from the edge region 50. Such removal may be done by physical scribing, laser scribing, chemical etching, sand blasting, etc. This approach is more wasteful compared to selective deposition of the active layer 37. After forming the active layer 37 over the selected regions of the conductive layer 37 and the conductive substrate 30, an insulating layer 36 is deposited at the edge region 50 as shown in the figure. A transparent conductive layer 38 and a finger pattern comprising fingers (not shown) and the busbar 39 are then deposited. One benefit of this approach is the fact that the insulating layer 36 is not exposed to the growth environment of the active layer 37. Solar cell absorber growth temperatures may be in the range of 200-600 C, the range typically being 400-550 C for $Cu(In,Ga)(Se,S)_2$. Growth temperatures for typical TCO's (such as ZnO and indium tin oxide), on the other hand, is in the range of 20-200 C. By depositing the insulating layer 36 after the formation of the active layer 37, one can avoid exposing the insulating layer 36 to high temperatures and therefore may use a large variety of organic resists that can operate at temperatures up to about 200° C.

It should be noted that in the above described embodiments the insulating layer 36 is in contact with the conductive layer 34 and/or the conductive substrate 33. This way the adhesion strength of the insulating layer may be very high. If the insulating layer 36 were deposited on the active layer 37, then the strength of the structure would depend on the adhesion strength between the insulating layer 36 and the active layer 37 as well as the adhesion strength between the active layer 37 and the conductive layer 34 and/or the conductive substrate 33. Therefore, structures resulting from the methods of the present invention are reliable since the generally weak interfaces between thin film absorber layers and their substrates are eliminated.

Figure 6:
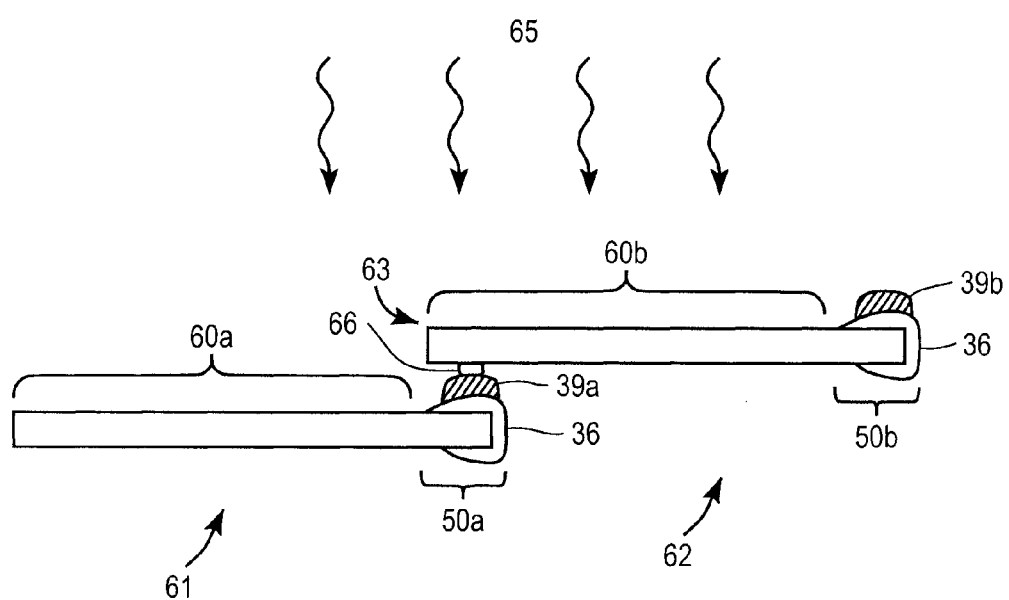
FIG. 6 shows a two-cell interconnected structure.

It should be noted that the edge region 50 in FIGS. 3, 4 and 5 is a dead region that does not generate power. This, however, does not cause efficiency drop in an interconnected module structure that shingles the solar cells as shown in FIG. 6. In FIG. 6 two solar cells, a lower cell 61 and an upper cell 62, fabricated in accordance with the teachings of this invention are shown. It should be noted that the details of the cell structure are not shown in this figure. The busbar 39a of the lower cell is aligned along the edge 63 of the upper cell such that the edge 63 extends over the edge region 50a of the lower cell 61. The edge region 50a of the lower cell 61 is the dead region of this cell, region 60a being the active region. Therefore shadowing of the illumination 65 by the upper cell 62 at the edge region 50a does not cause any power loss. By pressing the two cells together and optionally including an interconnection material 66 between the bottom surface of the top cell 62 and the busbar 39a of the first cell 61, the two cells are interconnected without loss of power. The interconnection material may be a solder, a conductive epoxy, a conductive ink etc. More cells may be added to the string of FIG. 6 to manufacture higher voltage modules. The strings may be packaged in protective materials for long term stability. It should be noted that the examples above used only on busbar along one edge of the solar cells. Two busbars along two or more edges may also be fabricated using the teachings of this invention, however at the expense of power loss due to increased dead region area. It is also possible to place the busbar away from the edges of the solar cell. When the busbar is at the edge of the device, the insulating layer 36 protects and insulates the edge of the conductive portions of the solar cells, especially if it is wrapped around the conductive substrate. This way shorting that may happen due to the interconnection material 66 seeping down along the edge of the cell is avoided.

It should be noted that the processing approaches of the present invention deposit insulating or high resistivity layer on the surface of the contact layer. Therefore, adhesion of the insulating film to the contact layer and thus to the substrate may be independently optimized. Absorber layer and/or the transparent conductive layer is then deposited over the insulating layer followed by the busbar. Any defectivity or adhesion issue in the portion of the transparent conductive layer and/or the absorber layer over the insulator film in this case does not cause a critical instability that will result in overall device malfunction. Since in thin film solar cell structures generated current within the absorber flows perpendicular to the substrate any leakage or shorting path between the busbar and the absorber layer does not introduce leakage in the device as long as there is an insulator film entirely under the absorber layer to prevent the occurrence of a leakage conductive path.

Although the present invention is described with respect to certain preferred embodiments, modifications thereto will be apparent to those skilled in the art.

The invention claimed is:

1. A solar cell structure comprising:
   a substrate with a top surface, an edge, a sidewall and a bottom surface;
   a conductive contact layer with a top surface disposed on the top surface of the substrate,
   an insulator film directly disposed on a region of the top surface of the conductive contact layer;
   an absorber layer disposed on at least another region of the conductive contact layer that is different from the region on which the insulator film is disposed, and wherein the absorber layer is not disposed on the region of the conductive contact layer where the insulator film is disposed;
   a transparent conductive layer disposed on at least the absorber layer; and
   a finger pattern including a set of fingers and a busbar, the finger pattern being disposed on the transparent conductive layer, wherein the busbar is aligned substantially over the insulator film so that the busbar is not disposed over the at least another region where the absorber layer is disposed on the conductive contact layer.

2. The solar cell structure according to claim 1 wherein the absorber layer is disposed on both the conductive contact layer and the insulator film such that a portion of the absorber layer is disposed over the conductive contact layer and another portion of the absorber layer is disposed over the insulator film, and wherein the transparent conductive layer is disposed over the absorber layer.

3. The structure according to claim 2 wherein the substrate is conductive.

4. The structure according to claim 3 wherein the transparent conductive layer includes at least one of Zn, In, Sn, Cd, S, and O.

5. The structure according to claim 4 wherein the transparent conductive layer is a $(Cd,Zn)S$/transparent conductive oxide stack.

6. The structure according to claim 5 wherein the absorber layer is a $Cu(In,Ga)(S,Se)_2$ layer.

7. The structure according to claim 2 wherein the region over which the insulator film is disposed is over and along an edge of the substrate.

8. The structure according to claim 7 wherein the insulator film further covers the sidewall of the substrate along the edge.

9. The structure according to claim 8 wherein the insulator further covers an edge region of the bottom surface of the substrate along the sidewall.

* * * * *